(12) United States Patent
Andersson et al.

(10) Patent No.: US 7,973,843 B2
(45) Date of Patent: Jul. 5, 2011

(54) ACTIVE PIXEL SENSOR WITH REDUCED FIXED PATTERN NOISE

(75) Inventors: Anders Andersson, Pasadena, CA (US); Sandor L. Barna, Pasadena, CA (US)

(73) Assignee: Aptina Imaging Corporation, George Town (KY)

( * ) Notice: Subject to any disclaimer, the term of this patent is extended or adjusted under 35 U.S.C. 154(b) by 120 days.

(21) Appl. No.: 12/413,134

(22) Filed: Mar. 27, 2009

(65) Prior Publication Data
US 2010/0079643 A1 Apr. 1, 2010

Related U.S. Application Data

(63) Continuation of application No. 11/045,155, filed on Jan. 31, 2005, now Pat. No. 7,525,582, which is a continuation of application No. 09/550,816, filed on Apr. 18, 2000, now Pat. No. 6,859,227.

(60) Provisional application No. 60/130,745, filed on Apr. 23, 1999.

(51) Int. Cl.
*H04N 5/335* (2011.01)
*H04N 5/217* (2011.01)
(52) U.S. Cl. ........................ 348/296; 348/241
(58) Field of Classification Search .................. 348/316, 348/317, 299, 298, 297, 296, 311, 302, 314, 348/241
See application file for complete search history.

(56) References Cited

U.S. PATENT DOCUMENTS

| | | | |
|---|---|---|---|
| 5,471,515 A * | 11/1995 | Fossum et al. | 377/60 |
| 5,541,402 A * | 7/1996 | Ackland et al. | 250/208.1 |
| 5,631,704 A * | 5/1997 | Dickinson et al. | 348/308 |
| 5,909,026 A * | 6/1999 | Zhou et al. | 250/208.1 |
| 6,002,432 A | 12/1999 | Merrill et al. | |
| 6,057,539 A * | 5/2000 | Zhou et al. | 250/208.1 |
| 6,069,377 A | 5/2000 | Prentice et al. | |
| 6,130,713 A | 10/2000 | Merrill | |
| 6,215,139 B1 | 4/2001 | Iida et al. | |
| 6,326,230 B1 | 12/2001 | Pain et al. | |
| 6,380,572 B1 * | 4/2002 | Pain et al. | 257/292 |
| 6,486,503 B1 * | 11/2002 | Fossum | 257/215 |
| 6,555,842 B1 * | 4/2003 | Fossum et al. | 257/59 |
| 6,624,456 B2 * | 9/2003 | Fossum et al. | 257/292 |
| 6,667,768 B1 * | 12/2003 | Fossum | 348/308 |
| 6,744,068 B2 * | 6/2004 | Fossum et al. | 257/59 |
| 6,825,059 B2 * | 11/2004 | Fossum | 438/60 |
| 7,002,626 B2 * | 2/2006 | Pain et al. | 348/241 |
| 7,095,440 B2 * | 8/2006 | Fossum | 348/308 |
| 7,105,371 B2 * | 9/2006 | Fossum et al. | 438/48 |
| 7,369,166 B2 * | 5/2008 | Fossum et al. | 348/308 |

* cited by examiner

*Primary Examiner* — Nicholas G Giles

(57) ABSTRACT

An image sensor includes pixels each of which is designed to transfer charge, accumulated in a photoactive region of the pixel during a first period, through a second active region of the pixel to a power supply node, and to transfer charge, accumulated in the photoactive region during a second period, through the second active region to a sense node in the pixel. Passing charge through the second active region prior to transferring it either to the power supply node or the sense node can help reduce fixed pattern noise. The image sensor can be operated in snap-shot mode.

4 Claims, 9 Drawing Sheets

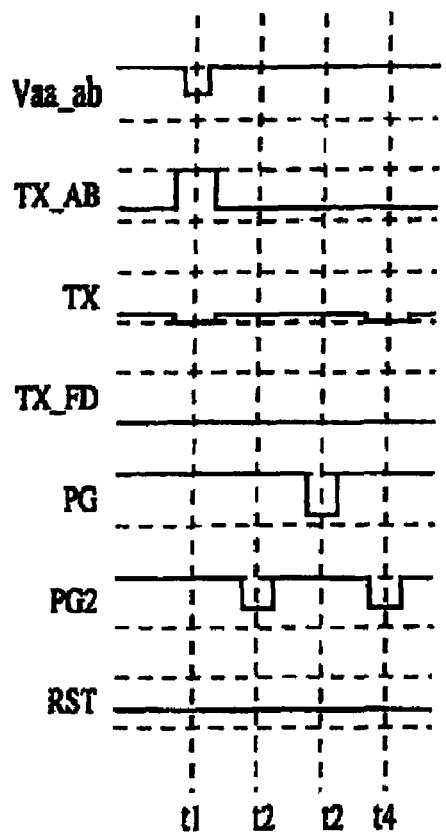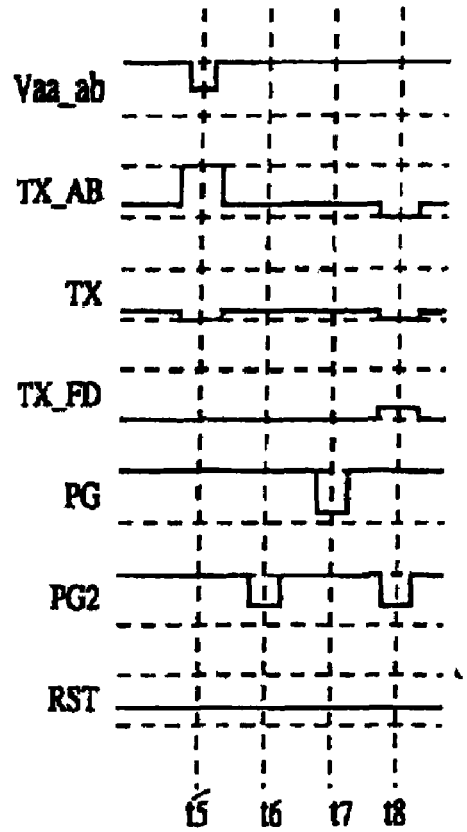
FIG. 5                    FIG. 7

ACTIVE PIXEL SENSOR WITH REDUCED FIXED PATTERN NOISE

CROSS-REFERENCE TO RELATED APPLICATIONS

The present application is a continuation application of U.S. patent application Ser. No. 11/045,155, filed Jan. 31, 2005, now U.S. Pat. No. 7,525,582 which is a continuation of U.S. patent application Ser. No. 09/550,816, filed on Apr. 18, 2000, now issued as U.S. Pat. No. 6,859,227, which claims the benefit of U.S. Provisional Application No. 60/130,745, filed Apr. 23, 1999, the disclosures of which are incorporated herein by reference in their entirety.

BACKGROUND

This invention relates to active pixel sensors with reduced fixed pattern noise.

Image sensors find applications in a wide variety of fields, including machine vision, robotics, guidance and navigation, automotive applications, and consumer products. Imaging circuits often include a two-dimensional array of photo-sensors each of which forms one picture element (pixel) of the image. Light energy emitted or reflected from an object impinges upon the array of photo-sensors and is converted by the photo-sensors to electrical signals. The individual photo-sensors can be scanned to read out and process the electrical signals.

One class of solid-state image sensors includes active pixel sensors (APS). An APS is a light-sensing device with sensing circuitry inside each pixel. Each active pixel includes a sensing element formed in a semiconductor substrate and capable of converting optical signals into electronic signals. As photons strike the surface of a photoactive region of the solid-state image sensors, free charge carriers are generated and collected. Once collected, the charge carriers, often referred to as a charge packet, are transferred to output circuitry for processing.

In an exemplary APS, charge carriers are collected in the photo-site via a photo-gate. The charge packet is stored in spatially defined depletion regions of the semiconductor, also known as potential wells, in the semiconductor substrate beneath the photo-site. The charge packet then is transferred to an isolated diffusion region via a transfer gate. The diffusion region receives the charge from the photo-gate well and sends a corresponding electrical signal to the pixel amplifier for further processing.

The near-surface potential within the semiconductor can be controlled, for example, by the potential of an electrode or gate near the semiconductor surface. If electrodes are at different voltages, they will form potential wells of different depths. Free positive charges (e.g., holes) move from a region of higher potential to a region of lower potential. Similarly, free negative charges (e.g., electrons) move from the region of lower potential to the region of higher potential.

An imager with a complementary metal-oxide semiconductor (CMOS) active pixel array can be operated in a rolling shutter mode in which each row of the array is exposed at different instants of time. However, for some applications, such as high-speed photography, it is desirable to operate the imager in a frame shutter mode in which all pixels have substantially identical integration stop and start times. Unfortunately, the use of multiple transfer gates in the latter type of imager can result in an undesirable fixed pattern noise (FPN). The FPN, which is a function of the threshold voltages of the transfer gates, generally differs from pixel to another. While errors resulting from the FPN can sometimes be ignored at low image gains, when the image gain is increased, such errors become significant.

SUMMARY

In general, a method of operating a pixel includes transferring charge, accumulated in a photoactive region of the pixel during a first period, through a second active region of the pixel to a power supply node, and transferring charge, accumulated in the photoactive region during a second period, through the second active region to a sense node in the pixel.

In various implementations, one or more of the following features may be present. For example, an amount of charge in the second active region can be set at substantially a predetermined level prior to transferring the charge accumulated during the first period. Similarly, the amount of charge in the second active region can be reset at substantially the predetermined level prior to transferring the charge accumulated during the second period. Setting and resetting the amount of charge in the second active region can include flooding the second active region with charge and subsequently transferring charge from the second active region to the power supply node.

An image sensor is disclosed and includes multiple pixels formed in a semiconductor substrate. Each pixel includes a photoactive region in the substrate, a second active region in the substrate separate from the photoactive region, a sense node and a power supply node. A controller is arranged to cause control signals to be provided to each pixel. As a result of the control signals, each pixel transfers charge, accumulated in the pixel's photoactive region during a first period, to the power supply node through the pixel's second active region. Charge accumulated in the pixel's photoactive region during a second period is transferred to the pixel's sense node through the pixel's second active region.

In general, the image sensor can include a controller arranged to cause control signals to be provided to each pixel so that the pixel can operate in any one of at least four modes. In a first mode, photocharge generated in the photoactive region is accumulated in the pixel's photoactive region. In a second mode, charge is transferred from the pixel's photoactive region to the pixel's second active region. In a third mode, charge is transferred from the pixel's second active region to the pixel's power supply node. In a fourth mode, charge is transferred from the pixel's second active region to the pixel's sense node.

The integration period for all the pixels in the array can occur at substantially the same time to allow snap-shot operation of the imager. The techniques disclosed below can be particularly advantageous for image sensors using active pixel sensors with photo-gates.

Various implementations can include one or more of the following advantages. For example, fixed pattern noise can be reduced. In particular, passing charge from the photoactive region through the second active region before transferring the charge either to the power supply node or the sense node can help ensure that the amount of charge transferred from the photoactive region to the second active region following pixel integration will be substantially equal to the signal charge. Therefore, enhanced and improved images can be obtained.

Other features and advantages will be apparent from the following detailed description, the accompanying drawings and the claims.

BRIEF DESCRIPTION OF THE DRAWINGS

FIG. 5 is a timing diagram of various control signals associated with FIGS. 4A through 4F.

FIG. 7 is a timing diagram of various control signals associated with FIGS. 6A through 6F.

DETAILED DESCRIPTION

Figure 1:
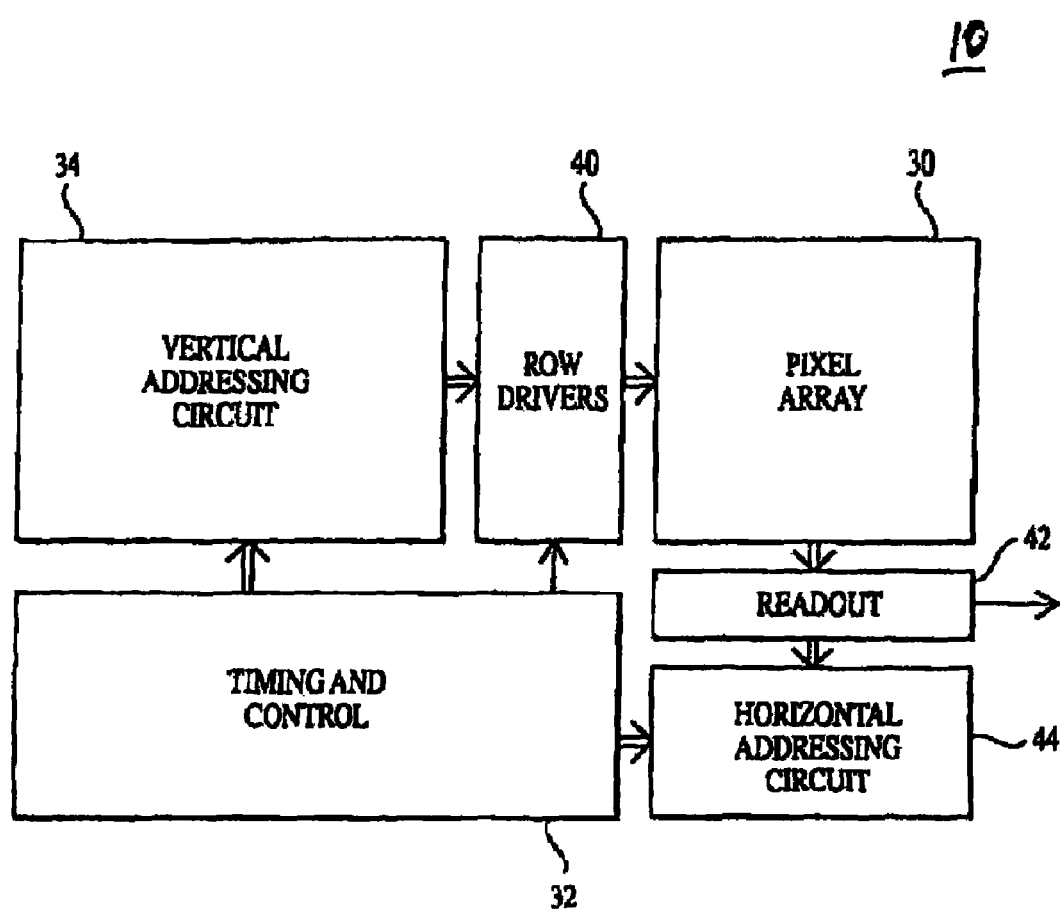
FIG. 1 is a block diagram of an exemplary CMOS active pixel sensor chip.

FIG. 1 shows an exemplary imager 10 implemented as a CMOS active pixel sensor integrated circuit chip. The imager 10 includes an array 30 of active pixel sensors and a controller 32 that provides control signals to enable reading out of signals stored in the pixels. The array 30 can be read out a row at a time using a parallel-column readout architecture. The controller 32 selects a particular row of pixels in the array 30 by controlling the operation of a vertical addressing circuit 34 and row drivers 40. Signals stored in the selected row of pixels are read out to circuitry 42 for amplifying the pixel signals and for converting the analog signals to corresponding digital signals. Signals for selecting the digital signals corresponding to a particular column in the array are provided from the controller 32 through a horizontal addressing circuit 44.

Figure 2:
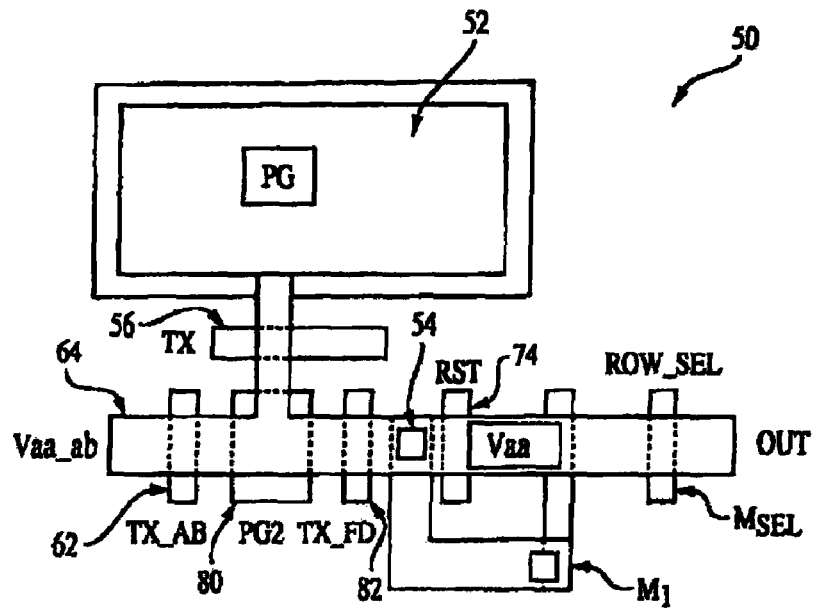
FIG. 2 illustrates an exemplary layout of an active pixel sensor according to the invention.
Figure 3A:
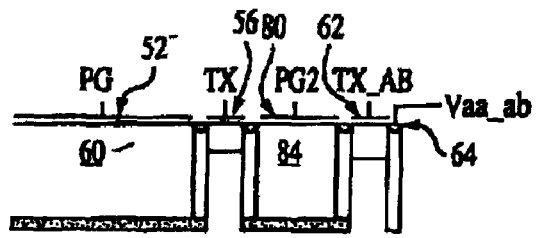
FIGS. 3A and 3B illustrate schematic cross-sections and potential well diagrams of the active pixel sensor.
Figure 3B:
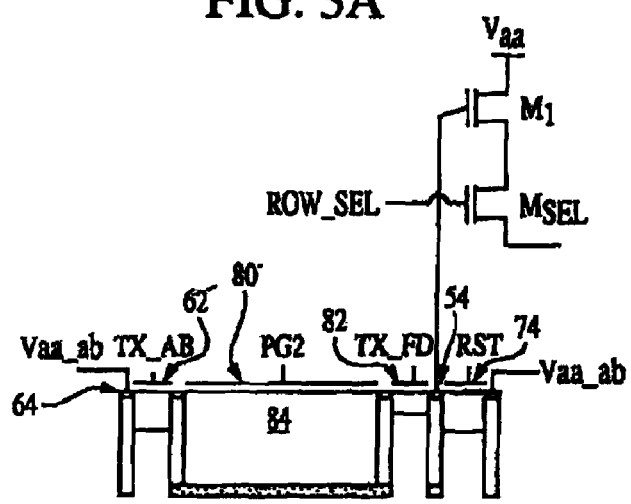

As shown in FIGS. 2, 3A and 3B, an exemplary pixel 50 in the array 30 includes a photo-sensitive element, which in the illustrated embodiment has a photo-gate 52. The photo-gate 52 is controlled by a signal (PG). In a first mode, when PG is a high signal, charge (Qsig) that is generated as a result of light impinging on the photosensitive element can be accumulated in a photoactive region 60 below the photo-gate 52.

A first transfer gate 56 separates the photo-gate 52 from a second active region 84 below a second gate 80. The first transfer gate 56 is controlled by a signal (TX), and the second gate 80 is controlled by a signal (PG2). In a second mode of operation, charge is transferred from the region 60 below the photo-gate 52 to the region 84 below the second gate 80. The region 84 below the second gate 80 serves as a transistor channel region.

The pixel includes a floating doped region 54 that serves as a sense node. A third transfer gate 82 can allow charge collected in the region 84 below the second gate 80 to be transferred to the sense node 54. A signal (TX_FD) applied to the third transfer gate 82 controls the state of that gate. The pixel also includes a fourth transfer gate 62 that serves as a shutter gate. A signal (TX_AB) applied to the fourth transfer gate 62 controls the state of that gate. The respective states of the second gate 80 and the third and fourth transfer gates 82, 62 determine whether charge collected beneath the second gate 80 remains in the region 84. In a third mode of operation, charge in the region 84 is transferred to a doped region 64 electrically coupled to a power supply voltage (Vaa_ab). The doped region 64 also can serve as an anti-blooming node. In a fourth mode of operation, charge in the region 84 is transferred to the sense node 54.

Signals from the sense node 54 are buffered by a source-follower switch $M_1$ and a pixel selection switch that can be implemented, for example, as a transistor $M_{sel}$. A signal (ROW_SEL) is applied to the gate of the pixel selection switch $M_{sel}$ to enable the pixel to be read out to the readout circuit 42 (FIG. 1). The output signal from a pixel in a particular row is read out via a conducting line 72 that is common to all pixels in a particular column.

The respective control signals can be applied electrically to each of the gates 56, 62, 74, 80 and 82.

The pixel 50 includes a reset gate 74 controlled by a signal (RST). When the sense node 54 of the pixel 50 is reset, charge in the sense node is drained to a doped region 58 that is electrically coupled to the power supply voltage Vaa.

The pixel 50 can include a metal shield (not shown) that covers the sense node 54. The shield also can cover active regions other than the photo-gate 52. For example, the various gates 56, 62, 80, 82 should be shielded. The shield helps prevent stray light from being collected by the sense node 54.

The integration period for all the pixels in the array can occur at substantially the same time to allow snap-shot operation of the imager 10. The reset and pixel selection signals (RST, ROW_SEL) are common to the pixels in a particular row of the array 30. In other words, each row of pixels is provided with its own reset and row selection signals. As explained below, the various control signals can be provided to the APS 30 to reduce or eliminate errors resulting from fixed pattern noise. The controller 32 controls the various control signals including PG, PG2, TX, TX_AB, TX_FD, RST and ROW_SEL.

The global pixel integration period, which can be common to all pixels in the array, includes the following operations: (a) preparation for pixel integration; (b) pixel integration; and (c) transfer of integrated charge from the photo-gate 52 to the sense node 54. Detailed operation of the photo-gate pixel 50 is now explained with reference to FIGS. 4A through 4F, FIGS. 6A through 6F, FIGS. 8A through 8C, and the timing diagrams of FIGS. 5 and 7.

Preparation for pixel integration commences by discarding unwanted charge that may have accumulated in the active region 60 under the photo-gate 52 during a shutter-closed period. The accumulated charge can be eliminated by transferring it to the power supply node 64. Initially, the second gate is placed in a predetermined state by fixing the charge in the region 84 at a predetermined level. To accomplish that, the active region 84 under the second gate 80 is flooded with charge (FIG. 4A) by raising the voltage signal (TX_AB) on the shutter gate 62 to the supply voltage level Vaa. In one implementation, Vaa is set to about 5 volts (V). At about the same time (t1 in FIG. 5), the voltage Vaa_ab is lowered to a level that preferably is less than Vaa–$V_T$, where $V_T$ is the threshold level of the shutter gate 62. The signal (TX) on the first transfer gate 56 and the signal (TX_FD) on the third transfer gate 82 are maintained at relatively low voltages (see t1 in FIG. 5). The various voltages then are restored to their original levels.

Figure 4A:
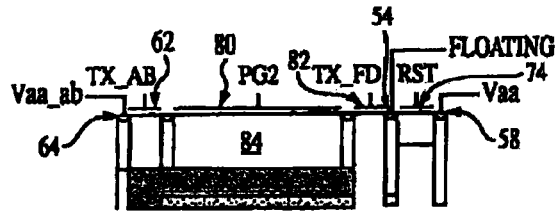
FIGS. 4A through 4F illustrate schematic cross-sections and potential well diagrams of the active pixel sensor during preparation for pixel integration according to an embodiment of the invention.
Figure 4B:
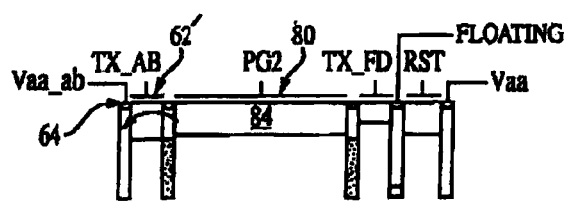
Figure 4C:
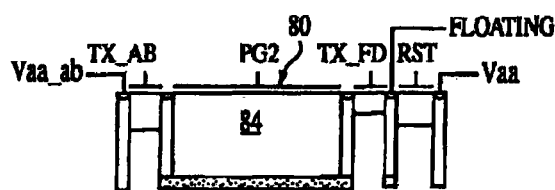

At a subsequent time (t2 in FIG. 5), the voltage (PG2) on the second gate 80 is lowered to allow charge in the region 84 to be transferred to the node 64 (FIG. 4B). In particular, the voltage (PG2) on the second gate 80 should be lowered to a level less than the voltage (TX_AB) on the shutter gate 62. When the signal (PG2) on the second gate 80 is returned to its original level, an amount of charge $Q_{rem(TX\_AB)}$ remains in the region 84 below the second gate (FIG. 4C), thus placing the second gate in a predetermined state.

Figure 4D:
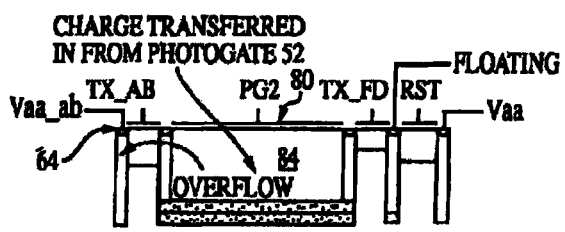

At a subsequent time (t3 in FIG. 5), the signal (PG) on the photo-gate is lowered to transfer the unwanted charge from the photo-gate 52 to the region 84 under the second gate 80 as shown in FIG. 4D. That charge represents charge that was integrated during the shutter-closed period. Further details relating to the transfer of charge from the photo-gate 52 to the region 84 under the second gate 80 are discussed below in connection with FIG. 8.

Figure 4E:
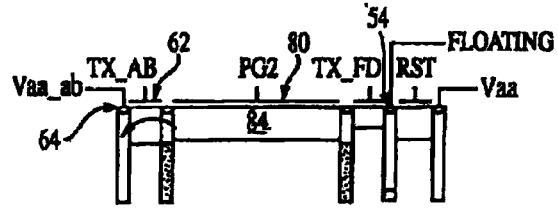

At a later time t4 (FIG. 5), the unwanted charge previously transferred to the region 84 below the second gate 80 is transferred to the power supply node 64 (FIG. 4E). That can be accomplished by lowering the voltage signal (PG2) on the second gate 80 to a level between the signal (TX) on the first transfer gate 56 and the signal (TX_AB) on the shutter gate 62.

Figure 4F:
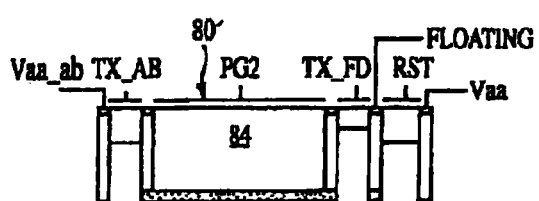

During the foregoing operations in preparation for pixel integration, the signal (TX_FD) on the third transfer gate 82 should be maintained at a relatively low level, such as zero volts, to prevent charge from leaking into the sense node 54. The signal (PG2) on the second gate 80 then is returned to its initial high level. An amount of charge $Q_{rem(TX\_AB)}$ remains in the region 84 below the second gate 80 (FIG. 4F).

A shutter-open, or pixel integration, operation allows an optical signal to impinge on the photo-gate 52 so that charge is integrated in the region 60. As previously noted, all pixels in the array can integrate signal charge at the same time.

Once the signal charge has been integrated by the pixel's photo-gate 52, the signal charge is transferred to the floating sense node 54. As discussed below, the transfer of charge from the photo-gate 52 to the floating sense node 54 occurs in a manner similar to the transfer of charge from the photo-gate to the power supply node 64 discussed above.

Figure 6A:
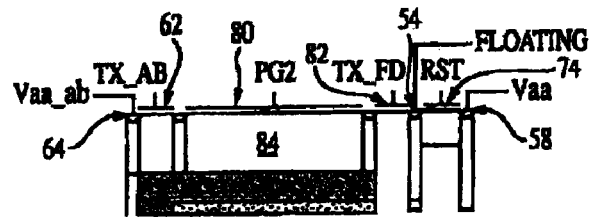
FIGS. 6A through 6F illustrate schematic cross-sections and potential well diagrams of the active pixel sensor following pixel integration according to an embodiment of the invention.

The second gate 80 is placed in a predetermined state by fixing the charge in the region 84 at substantially the same predetermined level as before. In particular, at a time t5 (FIG. 7), the region 84 under the second gate 80 is flooded with charge (FIG. 6A). That occurs in substantially the same manner as described above with respect to FIG. 4A. The various voltages then are restored to their original levels.

Figure 6B:
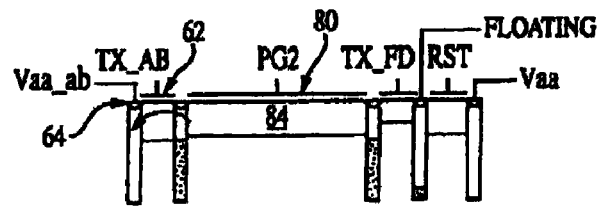
Figure 6C:
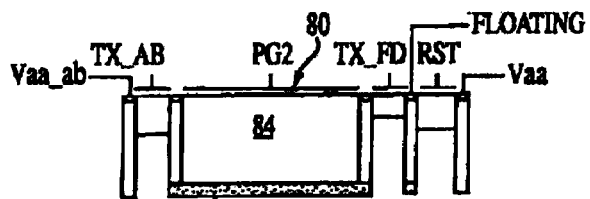

At a subsequent time (t6 in FIG. 7), the voltage (PG2) on the second gate 80 is lowered to allow charge in the region 84 to be transferred to the power supply node 64 (FIG. 6B). As before, the voltage (PG2) on the second gate 80 can be lowered to a level less than the voltage (TX_AB) on the shutter gate 62. When the signal (PG2) on the second gate 80 is returned to its original level, an amount of charge $Q_{rem(TX\_AB)}$ remains in the region 84 below the second gate 80 (FIG. 6C), thus placing the second gate in the predetermined state.

Figure 6D:
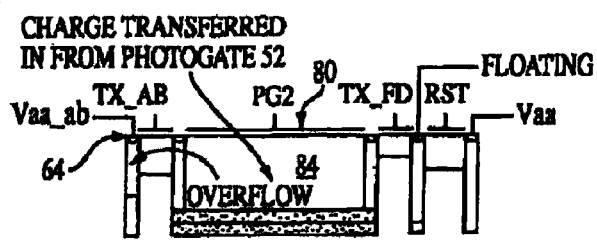

At a later time (t7 in FIG. 7), the signal (PG) on the photo-gate 52 is lowered to transfer the signal charge from the region 60 below the photo-gate to the region 84 below the second gate 80, as shown in FIG. 6D. In general, the same technique previously used to transfer unwanted charge from the region 60 below the photo-gate 52 to the region 84 (FIG. 4D) can be used to transfer the signal charge. Further details relating to the transfer of charge from the region 60 below the photo-gate 52 to the region 84 below the second gate 80 are discussed below in connection with FIG. 8.

Figure 6E:
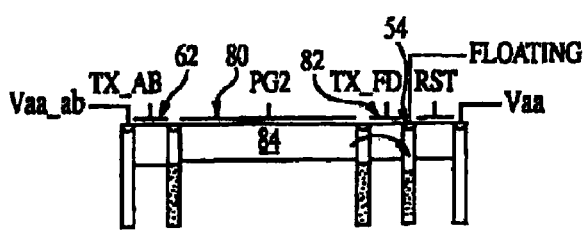

At a later time (t8 in FIG. 7), the signal charge previously transferred to the region 84 is transferred to the floating sense node 54 (FIG. 6E). That can be accomplished by lowering the voltage signal (PG2) on the second gate 80 to a level between the signal (TX_AB) on the shutter gate 62 and the signal (TX_FD) on the third transfer gate 82. To force the signal charge to the floating sense node 54, the voltage (TX_AB) on the shutter gate 62 can be lowered to ground, and the voltage (TX_FD) on the third transfer gate 82 can be raised to a level that is slightly higher than the original value of the signal (TX_AB).

Figure 6F:
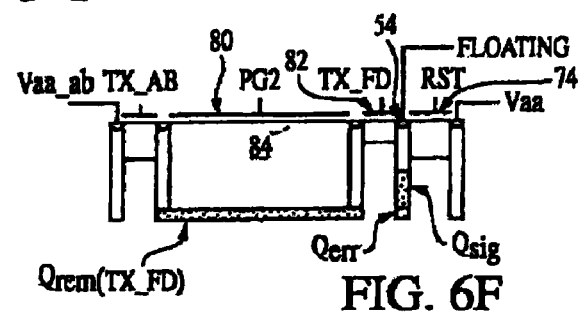

The signal (PG2) on the second gate 80 then is returned to its initial high level. An amount of charge $Q_{rem(TX\_AB)}$ remains in the region 84 below the second gate 80 (FIG. 6F). Assuming a signal charge $Q_{sig}$, the charge transferred to the floating sense node 54 will be approximately equal to $Q_{sig}+(Q_{rem(TX\_AB)}-Q_{rem(TX\_FD)})$. The component $(Q_{rem(TX\_AB)}-Q_{rem(TX\_FD)})$ represents the error charge($Q_{err}$). To ensure that the error charge ($Q_{err}$) has a positive value, the upper value of the signal (TX_FD) on the third transfer gate 82 should be slightly greater than the corresponding value of the signal (TX_AB) on the shutter gate 62. Additionally, the signal (RST) on the reset gate 74 should be held at a voltage slightly higher than the signal (TX_FD) on the second transfer gate 82 to prevent charge from overflowing from the floating sense node 54.

Figure 8A:
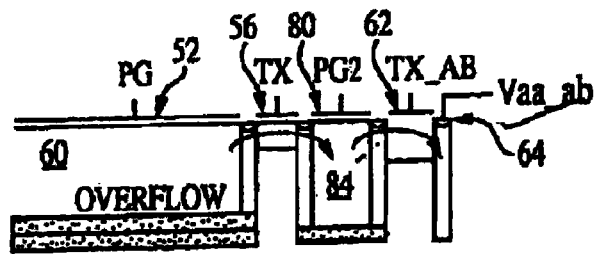
FIGS. 8A through 8C illustrate schematic cross-sections and potential well diagrams associated with the transfer of charge from the photo-gate to a charge storage gate according to an embodiment of the invention.
Figure 8B:
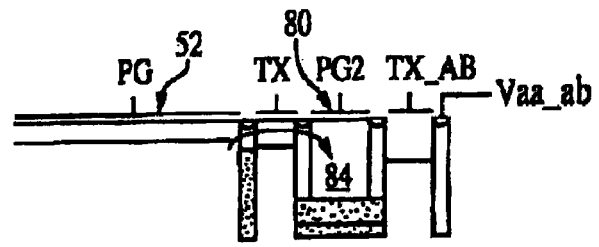
Figure 8C:
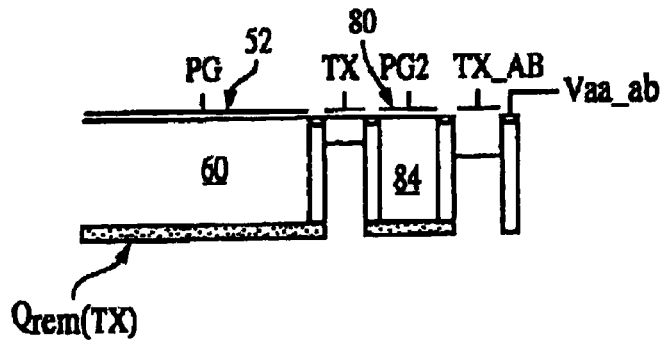

As described above, unwanted charge is transferred from the photo-gate 52 through the region 84 below the second gate 80 to the power supply node 64 (see FIGS. 4D and 4E). Similarly, signal charge is transferred from the photo-gate 52 through the region 84 to the sense node 54 (see FIGS. 6D and 6E). FIGS. 8A through 8C illustrate further details of how charge can be transferred from the photo-gate 52 to the region 84 below the second gate 80.

As shown in FIG. 8A, as charge is integrated in the region 60 beneath the photo-gate 52, any excess charge flows over the first transfer gate 56 to the region 84. If the region 84 becomes saturated, the charge will flow to the anti-blooming node 64. Overflow charge can be prevented from flowing to the floating sense node 54 (FIG. 3B) by maintaining the signal (TX_AB) on the shutter gate 62 at a higher voltage that the signal (TX_FD) on the third transfer gate 82.

As illustrated in FIG. 8B, accumulated charge can be transferred from the photo-gate 52 to the region 84 below the second gate 80 by lowering the voltage signal (PG) on the photo-gate while keeping the signal (PG2) at a high level. When the signal (PG) on the photo-gate 52 subsequently is returned to its high level, a charge $Q_{rem(TX)}$ remains in the region 60 below the first photo-gate (FIG. 8C). In general, substantially the same amount of charge $Q_{rem(TX)}$ remains in the region 60 each time charge is transferred from the photo-gate 52 to the region 84 below the second gate 80. Passing the charge from the photo-gate 52 through the second gate 80 ensures that the amount of charge transferred from the photo-gate to the second gate following the pixel integration period (in other words, at time t7 and as shown in FIG. 6D) will be substantially equal to the signal charge $Q_{sig}$.

Once the charge in the region 84 below the second gate 80 has been transferred to the floating sense node 54 (see FIGS. 6E and 6F), the pixels are read out row-by-row. In other words, although pixel integration and the transfer of signal charge to the pixel sense node can be performed for all pixels in the array at the same time, the pixels are read out row-by-row. Thus, each column of pixels can have separate circuitry for reading out the pixel signal and reset values.

Figure 10:
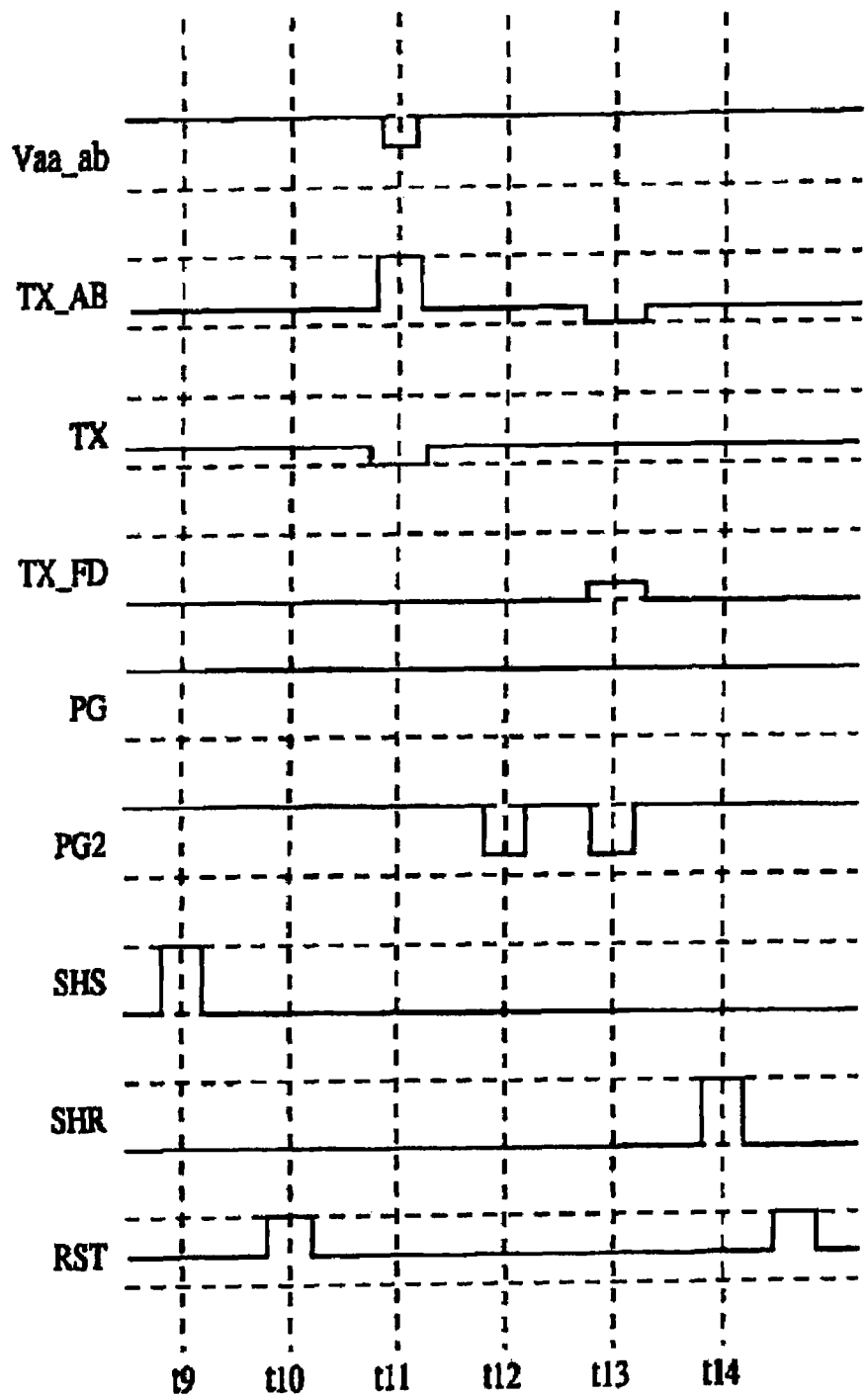
FIG. 10 is timing diagram of various control signals associated with FIGS. 9A through 9F.
Figure 11:
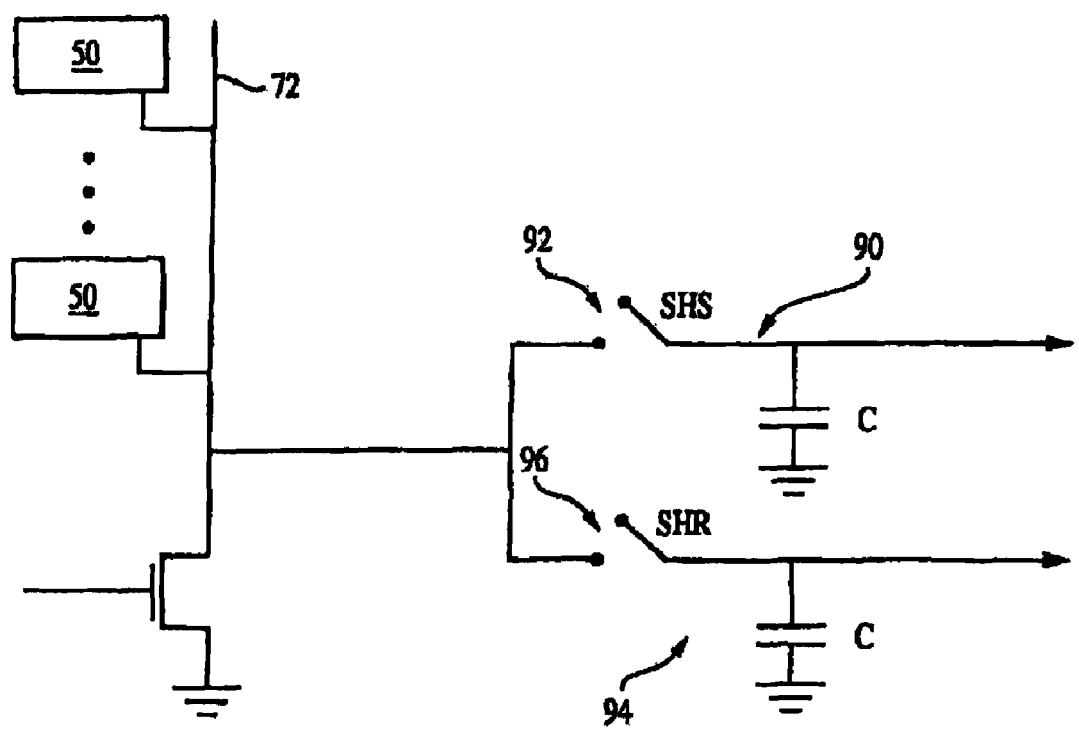
FIG. 11 illustrates an exemplary readout circuit associated with a column of pixels.

The signal level stored by each floating sense node 54 in a pixel 50 in a particular row is read onto a respective column readout line 72 through the source-follower M1 by enabling the corresponding row select switch $M_{SEL}$ (FIG. 3B). The voltage level of the pixel signal can be written as:

$$V_{reset} - [Q_{sig} + (Q_{rem(TX\_AB)} - Q_{rem(TX\_FD)})]/C_{fd},$$

where $V_{reset}$ is the reset voltage level on the gate 74, and $C_{fd}$ is the capacitance of the floating sense node 54. The pixel signal level can be read out to the column line 72 and then sampled, for example, using a first sample and hold circuit 90 (FIG. 11). The sample and hold circuit 90 allows the pixel signal level on the column line 72 to be sampled and stored when a signal SHS goes high (see t9 in FIG. 10). The signal SHS controls the state of a switch 92, which is closed when SHS goes high. The signal SHS can be common to each first sample and hold circuit.

Figure 9A:
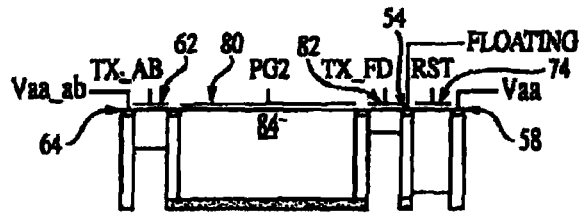
FIGS. 9A through 9F illustrate schematic cross-sections and potential well diagrams associated with reading out pixel signal and reset levels according to an embodiment of the invention.

At a subsequent time (t10 in FIG. 10)—after sampling the pixel signal levels—the floating sense node 54 of each pixel in the particular row is reset to the voltage level that was present prior to the charge transfer from the region 84 below the second gate 80 (FIG. 9A).

Figure 9B:
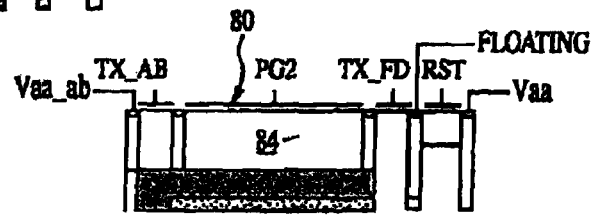
Figure 9C:
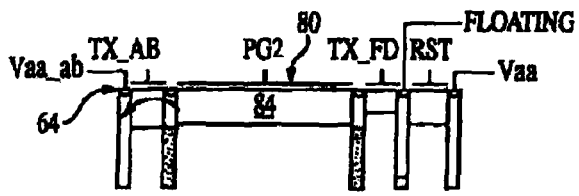
Figure 9D:
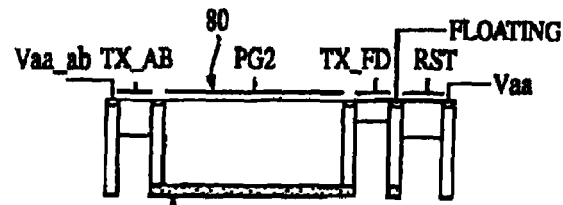

The second gate 80 then is returned to a predetermined state. At time t11, the region 84 is flooded with charge (FIG. 9B). The various voltages then are restored to their original levels. At a subsequent time (t12 in FIG. 10), the voltage (PG2) on the second gate 80 is lowered to allow charge in the region 84 to be transferred to the node 64 (FIG. 9C). When the signal (PG2) on the second gate 80 is returned to its original level, an amount of charge $Q_{rem(TX\_AB)}$ remains in the region 84 below the second gate 80 (FIG. 9D), thus placing the second gate 80 in the predetermined state.

Figure 9E:
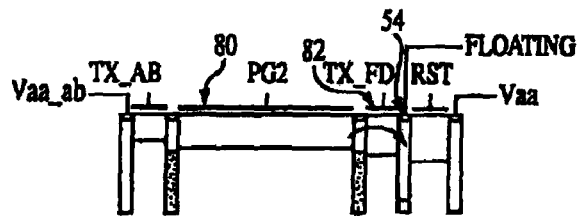

Next, at a time t13, the charge in the region 84 is transferred to the floating sense node 54 (FIG. 9E). As previously discussed, that can be accomplished by, lowering the voltage signal (PG2) on the second gate 80 to a level between the signal (TX_AB) on the shutter gate 62 and the signal (TX_FD) on the third transfer gate 82.

The foregoing operations to transfer the pixel reset level to the sense node 54 are substantially similar to the operations previously performed to transfer the pixel signal level to the sense node, except that, with respect to the pixel reset level, charge is not transferred from the photo-gate 52 to the region 84 below the second gate 80.

The charge transferred at time t13 to the sense node 54 is approximately $Q_{rem(TX\_AB)} - Q_{rem(TX\_FD)}$, in other words, it is substantially equal to the error charge ($Q_{err}$). Thus, the voltage of the pixel reset level can be written as:

$$V_{reset} - [(Q_{rem(TX\_AB)} - Q_{rem(TX\_FD)})]/C_{fd}.$$

The pixel reset level can be read out to the column line 72 and then sampled, for example, using a second sample and hold circuit 94 (FIG. 11). The sample and hold circuit 94 allows the pixel reset level on the column line 72 to be sampled and stored when a signal SHR goes high (see t14 in FIG. 10). A switch 96 is closed when SHR goes high. The signal SHR can be common to each of the second sample and hold circuits. The circuit shown in FIG. 11 is exemplary only, and other circuits can be used to sample the pixel signal and reset levels.

Processing circuitry (not shown) then can be used to obtain a differential signal based on the sampled pixel signal and reset levels. The resulting differential signal is substantially proportional to $Q_{sig}$ with the error component $Q_{err}$ eliminated.

Figure 9F:
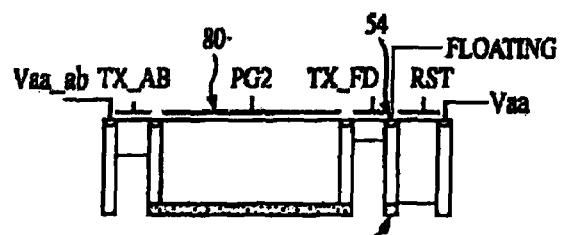

At time t15 (FIG. 10), the sense node 54 in each pixel in the particular row can be reset once again (FIG. 9F) in preparation for the next frame transfer.

The foregoing pixel readout operations can be performed for each row of pixels in the array before performing the next frame transfer.

Other implementations are within the scope of the claims.

What is claimed is:

1. A pixel array, comprising:
    a plurality of pixels, each pixel including:
        a photoactive region and an active region separated by a first transfer gate, anti-blooming and storage regions selectively connectable to the active region and separated from the active region by second and third transfer gates, respectively, and a reset gate selectively connectable to the storage region; and
    a controller operable to control the transfer and reset gates of the plurality of pixels, wherein the controller is operable to:
        set the active region of a pixel to a predetermined charge level;
        cause charge accumulated in the photoactive region of the pixel during a non-charge integration period to be transferred to the active region of the pixel;
        cause charge from the active region to be transferred to the anti-blooming region of the pixel;
        reset the active region to the predetermined charge level;
        cause charge accumulated in the photoactive region during a charge integration period to be transferred to the active region of the pixel; and
        cause charge from the active region to be transferred to the storage region of the pixel.

2. The pixel array of claim 1, wherein the controller is operable to provide control signals to the transfer gates in each pixel to cause a predetermined amount of charge to be transferred to a respective active region prior to a charge transfer from a respective photoactive region to a respective active region.

3. The pixel array of claim 1, wherein the controller is operable to provide control signals to each pixel to cause the pixels to transfer charge accumulated in their photoactive regions during a common integration period to their respective storage nodes at substantially the same time.

4. The pixel array of claim 1, wherein the controller is operable to control the transfer and reset gates of each of the plurality of pixels in any one of four modes:
    a first mode in which charge is accumulated in each photoactive region;
    a second mode in which charge is transferred from the photoactive region through the first transfer gate to the active region;
    a third mode in which charge is transferred from the active region through the second transfer gate to the anti-blooming region; and
    a fourth mode in which charge is transferred from the active region through the third transfer gate to the storage region.

* * * * *